United States Patent
Zhang

(10) Patent No.: US 8,992,692 B2
(45) Date of Patent: Mar. 31, 2015

(54) ADJUSTABLE BRUSH CLEANING APPARATUS FOR SEMICONDUCTOR WAFERS AND ASSOCIATED METHODS

(75) Inventor: John H. Zhang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 559 days.

(21) Appl. No.: 13/365,420

(22) Filed: Feb. 3, 2012

(65) Prior Publication Data

US 2013/0199563 A1   Aug. 8, 2013

(51) Int. Cl.
| | |
|---|---|
| *B08B 1/02* | (2006.01) |
| *B08B 1/04* | (2006.01) |
| *H01L 21/67* | (2006.01) |
| *H01L 21/68* | (2006.01) |
| *A46B 13/00* | (2006.01) |
| *A46B 15/00* | (2006.01) |
| *H01L 21/02* | (2006.01) |

(52) U.S. Cl.
CPC ......... *H01L 21/67046* (2013.01); *A46B 13/001* (2013.01); *A46B 15/0004* (2013.01); *H01L 21/02052* (2013.01); *H01L 21/681* (2013.01); *Y10S 134/902* (2013.01)
USPC .................. 134/18; 134/6; 134/902; 15/88.2; 15/88.3; 15/88.4

(58) Field of Classification Search
CPC ............ H01L 21/304; H01L 21/67046; H01L 21/681; B08B 1/04; Y10S 134/902
USPC ................ 134/6, 902; 15/77, 88.2, 88.3, 88.4
See application file for complete search history.

(56) References Cited

U.S. PATENT DOCUMENTS

| | | | |
|---|---|---|---|
| 5,475,889 A | 12/1995 | Thrasher et al. | ............... 15/88.3 |
| 5,806,126 A | 9/1998 | De Larios et al. | .............. 15/102 |
| 5,947,134 A * | 9/1999 | Kim et al. | .................. 134/57 R |
| 6,425,158 B2 | 7/2002 | Ravkin | .............................. 15/77 |
| 6,546,941 B1 * | 4/2003 | Nishihara | ..................... 134/157 |
| 6,622,334 B1 | 9/2003 | Ziemins et al. | .................... 15/77 |
| 7,231,682 B1 | 6/2007 | Boyd et al. | ......................... 15/77 |
| 7,507,296 B2 | 3/2009 | Sugarman et al. | ............... 134/6 |
| 7,625,452 B2 | 12/2009 | De Larios et al. | ............. 134/32 |
| 2005/0229950 A1 * | 10/2005 | Chou et al. | ..................... 134/18 |
| 2009/0031512 A1 | 2/2009 | Sin et al. | ........................... 15/77 |

OTHER PUBLICATIONS

Machine translation: KR20050068200A; Choi, Jun Min; Jul. 2005.*
Entegris "*Post-CMP Clean PVA Brush Advancements an Characterizaiton in CU/Low-k Applications*", 2007.

(Continued)

*Primary Examiner* — Nicole Blan
*Assistant Examiner* — Natasha Campbell
(74) *Attorney, Agent, or Firm* — Allen, Dyer, Doppelt, Milbrath & Gilchrist, P.A.

(57) ABSTRACT

A cleaning apparatus for cleaning a semiconductor wafer includes a rotary brush to be positioned to clean the semiconductor wafer, and an optical sensing device associated with the rotary brush to sense a separation distance between a reference position thereon and the semiconductor wafer. An actuator is coupled to the optical sensing device to position the rotary brush based upon the sensed separation distance.

31 Claims, 14 Drawing Sheets

(56) References Cited

OTHER PUBLICATIONS

"CETR-PMT-4 Post Chemical Mechanical Polishing Cleaning Brush Tester" http://www.ruker-axs.com/cetr-pmt-4-post-cmp-cleaning-brush-tester.html Printed Dec. 27, 2011.

"Brush scrubbing emerges as future wafer-cleaning technology" http://www.electroiq.com/articles/sst/print/volume-40/issue-7/departments/lithography/ . . . Printed Dec. 27, 2011.

* cited by examiner

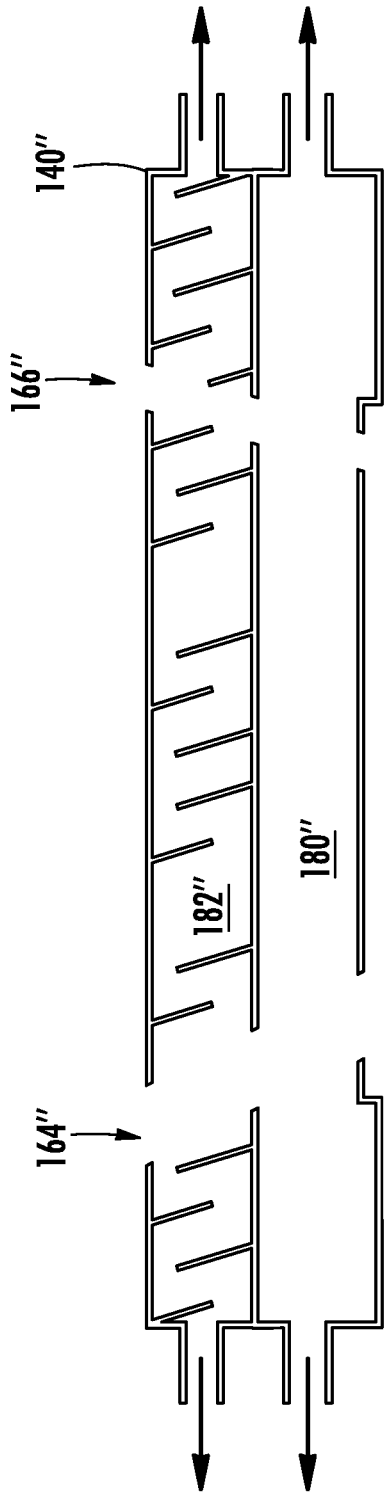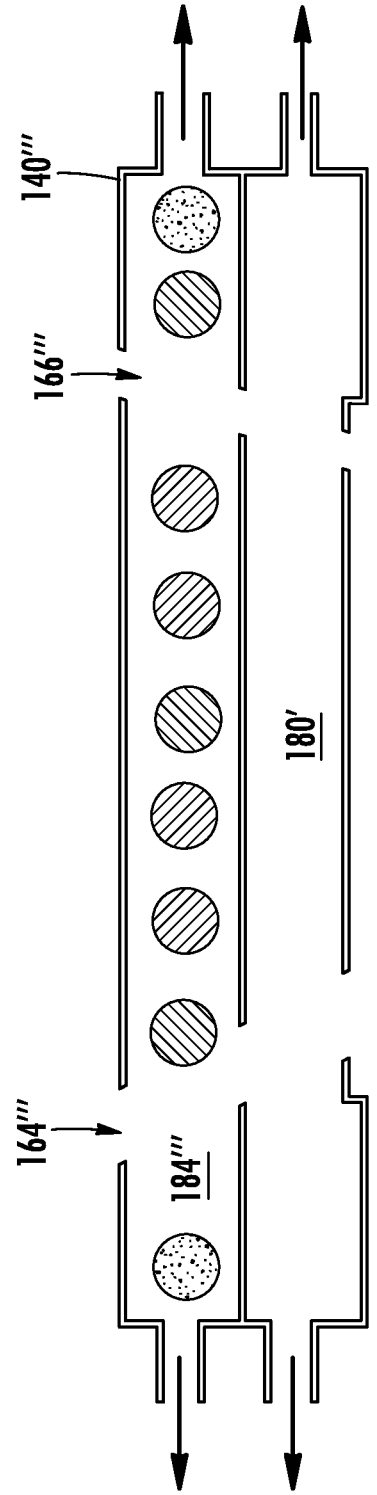

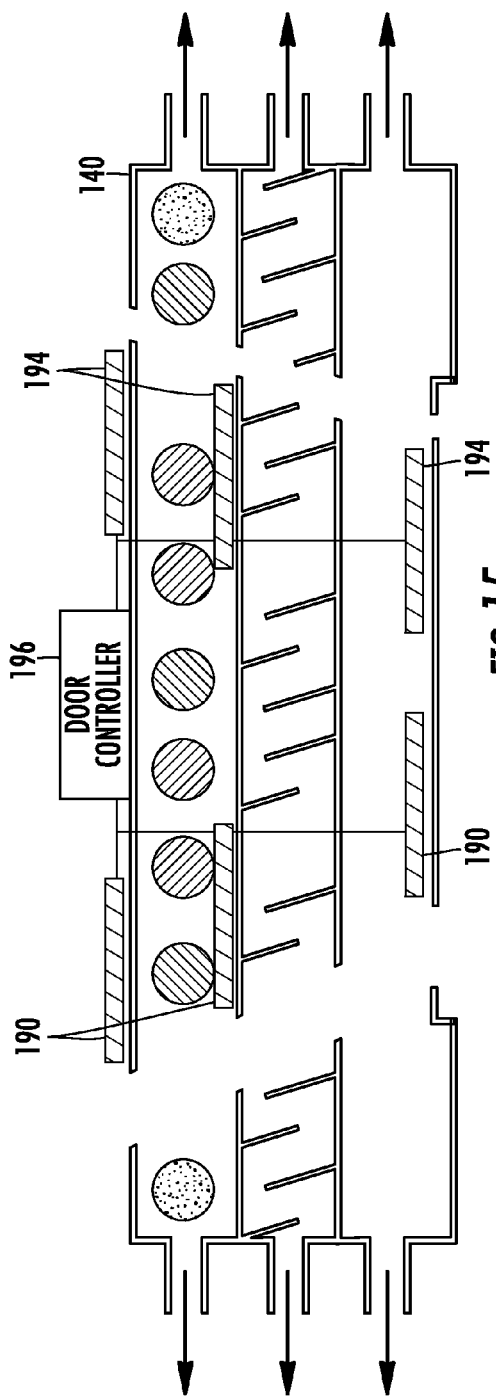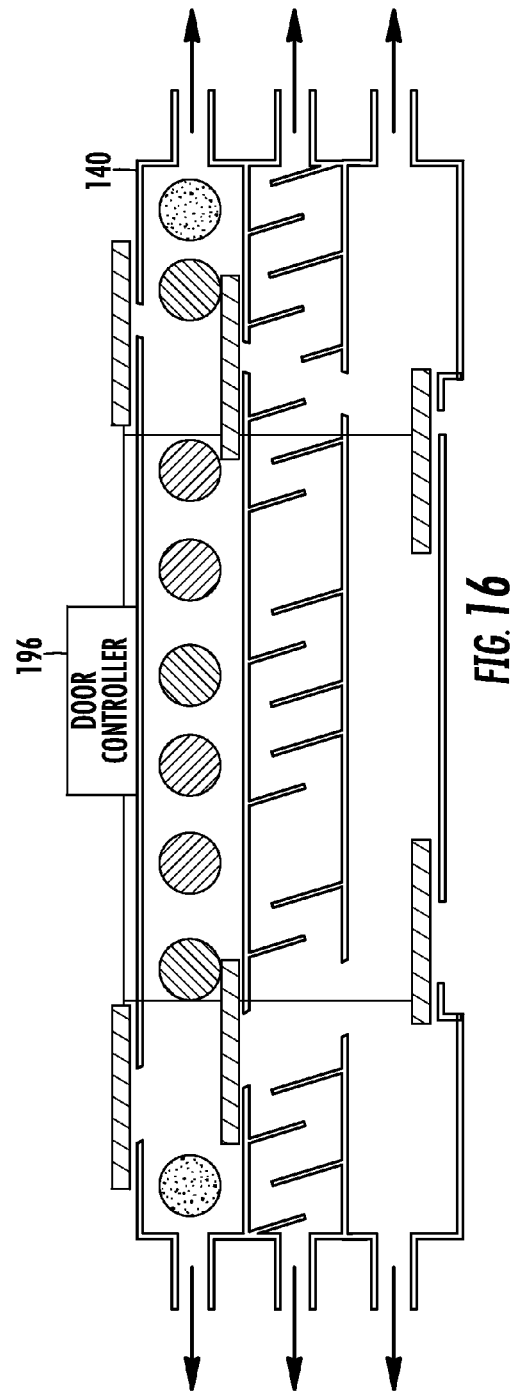

ADJUSTABLE BRUSH CLEANING APPARATUS FOR SEMICONDUCTOR WAFERS AND ASSOCIATED METHODS

FIELD OF THE INVENTION

The present invention relates to the field of semiconductor wafers, and more particularly, to an apparatus and method for brush cleaning semiconductor wafers.

BACKGROUND OF THE INVENTION

Chemical-mechanical polishing (CMP) is performed in the processing of semiconductor wafers. A standard CMP apparatus has a circular polishing pad and a rotating carrier for holding a semiconductor wafer. An abrasive slurry is used on the polishing pad. After a CMP operation, residual particles are left on the surface of the semiconductor wafer. These residual particles need to be removed.

Semiconductor wafers are typically cleaned in a cleaning apparatus which includes one or more brush stations each having a pair of rotary brushes for cleaning the major surfaces of the wafers. A conventional cleaning apparatus 10 is illustrated in FIG. 1. The cleaning apparatus 10 includes a pair of brushes 12 that clean the major surfaces of a semiconductor wafer 14 placed therebetween. The semiconductor wafer 14 is supported by rollers 16, which are also used to rotate the wafer. The cleaning apparatus 10 includes at least one spray bar 18 to direct a spray of fluid towards the semiconductor wafer 14.

As semiconductor processes continue to achieve smaller line widths to create semiconductor wafers with greater capacity, post CMP defects control becomes more important for improving wafer yield and reliability. A key factor in brush cleaning is to precisely control the distance between the brush and the semiconductor wafer. If the separation distance is too tight, the residual particles from the CMP operation will scratch 20 the semiconductor wafer 14 as they are brushed off, as illustrated in a highlighted section 21 of the wafer as provided in FIG. 2. If the separation distance is to loose, some of the residual particles will not be removed. For example, a residual particle 22 may cause a short between two lines 24 and 26, as illustrated in a highlighted section 27 of the wafer as also provided in FIG. 2. Since the brushes 12 directly contact the semiconductor wafer 14 during cleaning, the separation distance is with respect to a reference position that is inward from a contact surface on the wafer.

Position of the brushes relative to the semiconductor wafer may be adjusted based on pressure sensors that detect pressure each brush applies to the wafer. For example, U.S. Pat. No. 5,475,889 discloses a brush assembly that includes a first rotary brush, a brush carriage having first and second arms, a second rotary brush, and a pressure adjustment assembly positioned to engage at least one of the arms of the brush carriage. The pressure adjustment assembly is configured to adjust the pressure applied to the wafer surfaces by the first and second rotary brushes. The brush assembly further includes a control system coupled to the pressure adjustment assembly for controlling operation of the pressure adjustment assembly to selectively increase and decrease the pressure applied to the wafer by the first and second rotary brushes.

As an alternative to monitoring pressure, the torque of a brush rotation motor may be monitored. U.S. Pat. No. 7,507,296 discloses monitoring the torque of a brush rotation motor while a brush is in contact with the semiconductor wafer and is being rotated by the motor. The position of the brush relative to the semiconductor wafer may be adjusted based on the monitored torque to regulate the pressure applied to the wafer by the brush.

Further developments on monitoring position of the brushes relative to the semiconductor wafer are still desired. This is particularly so as semiconductor processes continue to achieve smaller line widths to create semiconductor wafers with greater capacity.

SUMMARY OF THE INVENTION

In view of the foregoing background, it is therefore an object of the present invention to improve how brushes for a cleaning apparatus are positioned relative to the semiconductor wafer.

This and other objects, features, and advantages in accordance with the present invention are provided by a cleaning apparatus for cleaning a semiconductor wafer comprising at least one rotary brush configured to be positioned to clean the semiconductor wafer, and at least one optical sensing device associated with the at least one rotary brush to sense a distance between a reference position thereon and the semiconductor wafer. At least one actuator may be coupled to the at least one optical sensing device and be configured to position the at least one rotary brush based upon the distance between the reference position on the at least one rotary brush and the semiconductor wafer.

By precisely controlling the separation distance between the reference position and the semiconductor wafer, the rotary brushes may be positioned so that wafer yield and efficiency may advantageously be improved.

The at least one optical sensing device may be carried by the at least one rotary brush. The at least one rotary brush may comprise at least one optical window, with the at least one optical sensing device being aligned with the at least one optical window. Alternatively, the at least one optical sensing device may be external from the at least one rotary brush.

The cleaning apparatus may further comprise a controller configured to determine a difference between the sensed separation distance and a desired separation distance, and to operate the at least one actuator based on the determined difference.

The at least one optical sensing device may comprise a transmitter for transmitting an optical signal to a surface of the semiconductor wafer, and a receiver for receiving a reflected optical signal from the surface of the semiconductor wafer. The optical signal and the reflected optical signal may be used to sense the separation distance.

In another embodiment, the at least one rotary brush may comprise first and second rotary brushes on opposites sides of the semiconductor wafer, and the at least one optical sensing device may comprise first and second optical sensing devices. The first optical sensing device may be associated with the first rotary brush, and may comprise a transmitter for transmitting an optical signal through the semiconductor wafer. The second optical sensing device may be associated with the second rotary brush, and may comprise a receiver for receiving the optical signal, with the received optical signal being used to sense the separation distance. The transmitted optical signal comprises a desired separation distance so that first and second actuators position the first and second rotary brushes to the desired separation distance.

Another aspect is directed to a method for cleaning a semiconductor wafer with a cleaning apparatus as defined above. The method may comprise positioning the at least one rotary brush to clean the semiconductor wafer, operating the at least one optical sensing device associated with the at least one rotary brush to sense a separation distance between a reference position thereon and the semiconductor wafer, and operating the at least one actuator to position the at least one rotary brush based upon the sensed separation distance.

BRIEF DESCRIPTION OF THE DRAWINGS

FIGS. 12, 13 and 14 are cross-sectional side views of different embodiments of an exhaust control cap in accordance with the present invention.

FIG. 15 is a cross-sectional side view of the exhaust control cap illustrated in FIG. 11 with cap loading and unloading slot doors in the open position.

FIG. 16 is a cross-sectional side view of the exhaust control cap illustrated in FIG. 11 with cap loading and unloading slot doors in the closed position.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notations are used to indicate similar elements in alternative embodiments.

Figure 1:
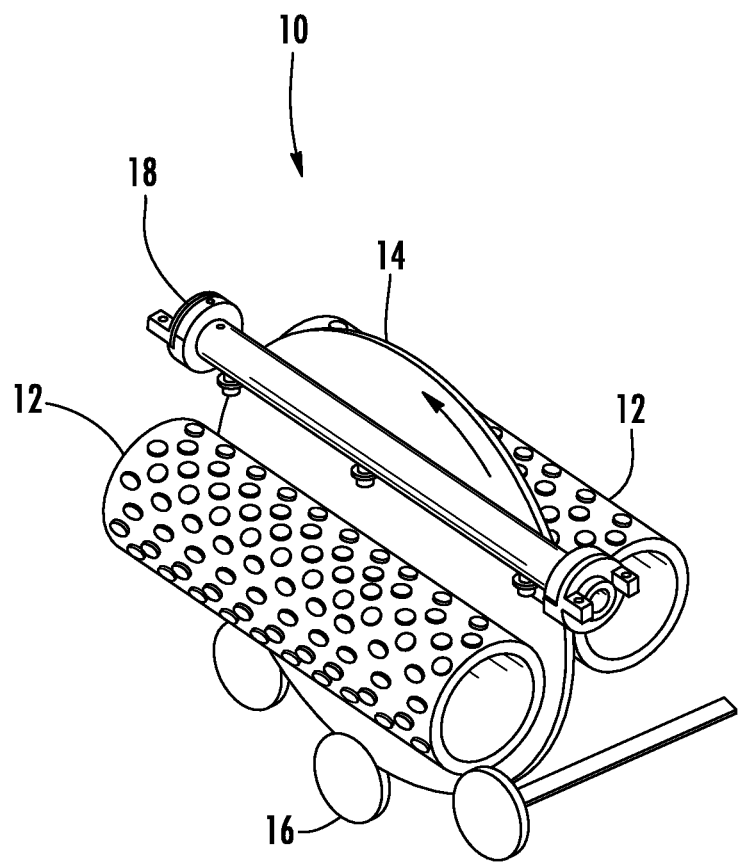
FIG. 1 is a perspective view of a brush cleaning apparatus in accordance with the prior art.
Figure 2:
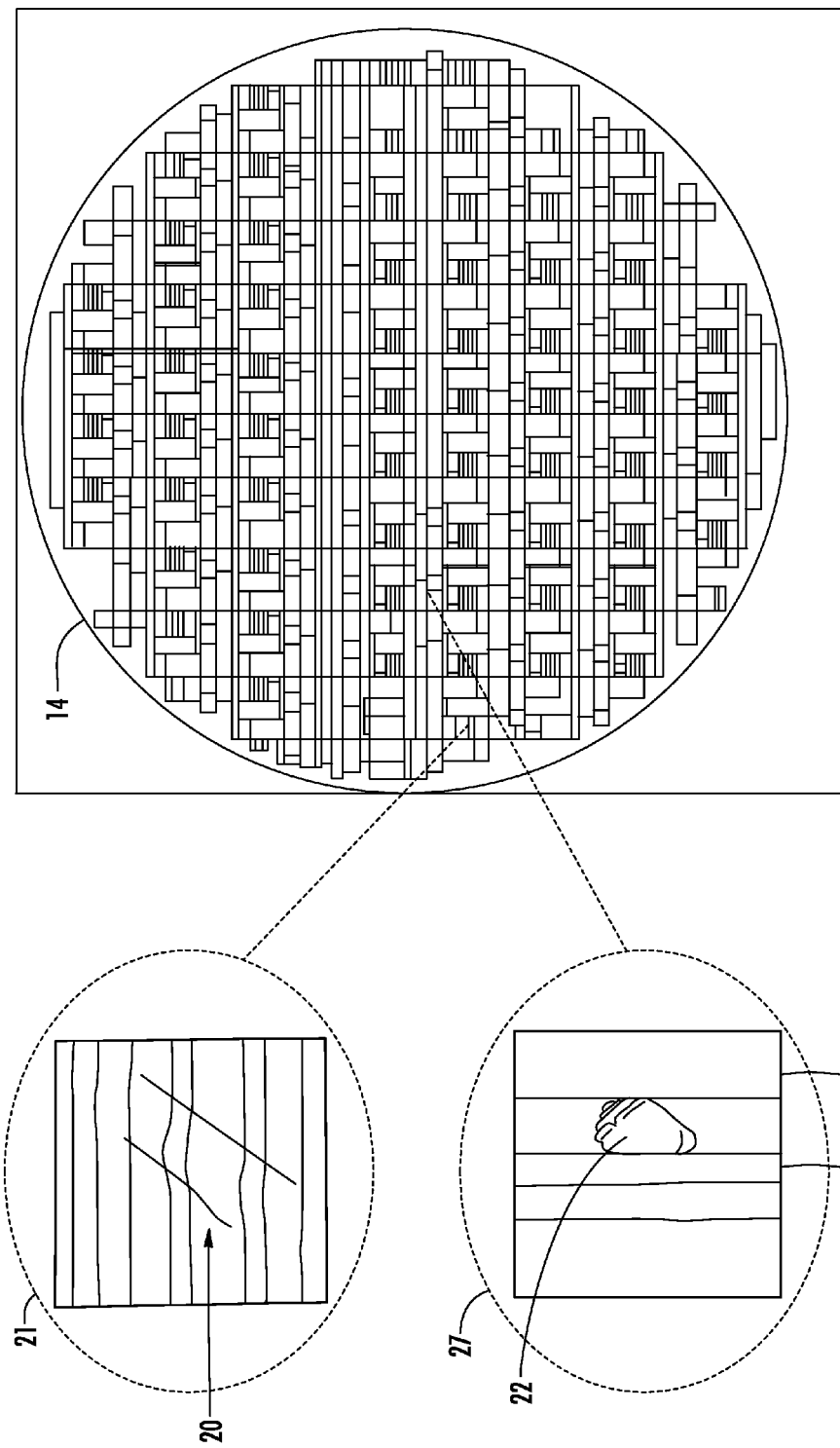
FIG. 2 is a semiconductor wafer with highlighted sections illustrating a scratch and a residual particle not removed during a cleaning operation in accordance with the prior art.
Figure 3:
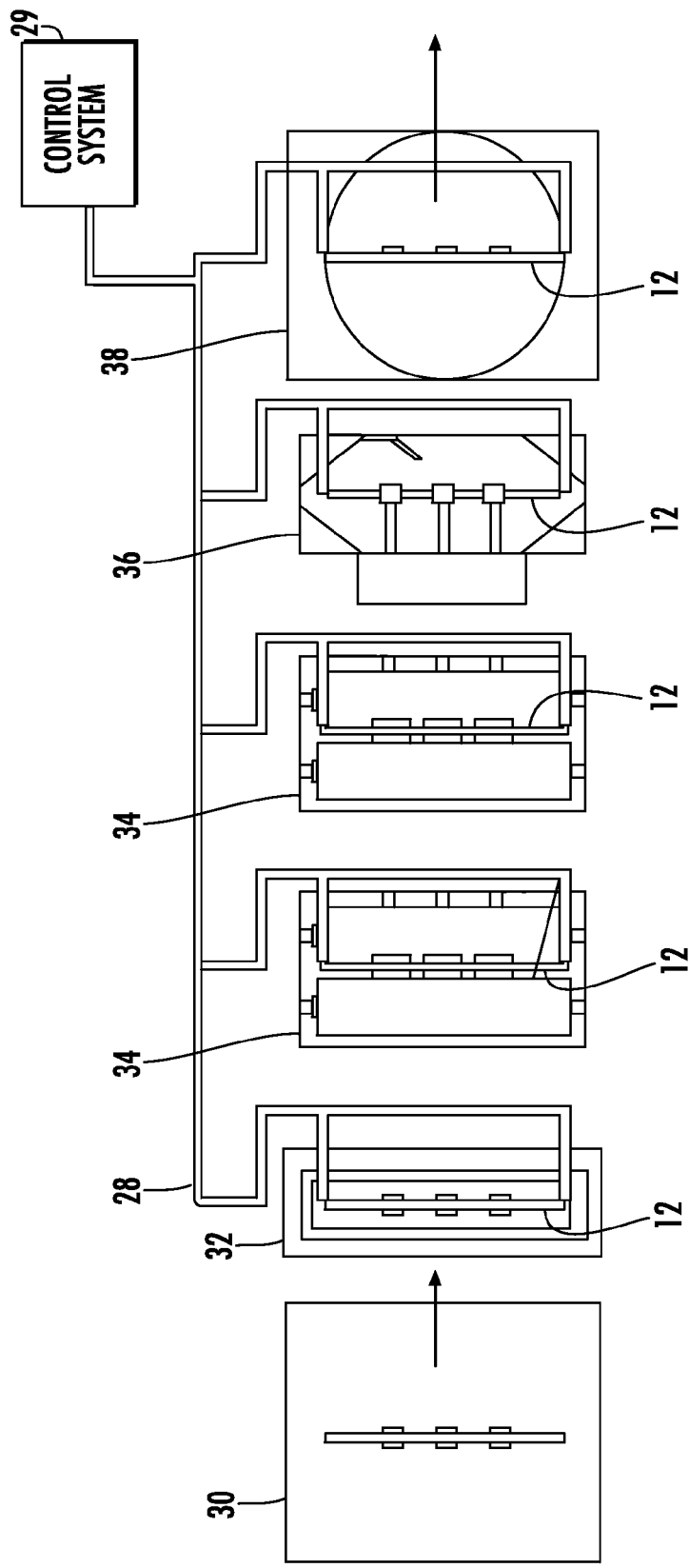
FIG. 3 is a schematic diagram of post CMP cleaning stations in accordance with the present invention.

An overview of post chemical-mechanical polishing (CMP) cleaning stations used to clean semiconductor wafers 12 after CMP will initially be discussed in reference to FIG. 3. Each clean station represents one or more steps in the post CMP wafer buffing and cleaning process. For maximum throughput, at least one semiconductor wafer 12 is simultaneously processed by each clean station. Control and synchronization of the clean stations are provided via a connected interface 28 coupled to a control system 29.

As readily appreciated by those skilled in the art, an acidic (low pH) cleaning process is used. The cleaning process may include a hydrofluoric (HF) or standard clean 1 (SC2) cleaning process. To withstand the corrosive effects of the acid, plastic components in the different stations may be used. The plastic may include materials such as PET, aceta (DELRIN), teflon, polypropylene (polypro), polyuerethane. Metal components may also be used, such as stainless steel.

Prior to cleaning, the semiconductor wafers 12 are stored in a wet load station 30. The first clean station is a megasonic tank 32, which uses acoustic waves to initially clean the semiconductor wafer 12. Similar to ultrasonic cleaning, megasonics utilizes a transducer, usually composed of piezoelectric crystals to create megasonic energy. Megasonic energy is of a higher frequency (800-2000 kHz) than typical ultrasonic cleaners (<100 kHz). As a result, the cavitation that occurs is gentler and on a much smaller scale.

The second and third clean stations are brush cleaning apparatuses 34. After the initial cleaning of the semiconductor wafer 12 in the megasonic tank 32, the wafer is subjected to back-to-back brush cleaning. Each brush cleaning apparatus 32 may use dionized (DI) water as part of the cleaning process. In some applications, hydrofluoric (HF) acid may be used as an alternative. Each semiconductor wafer 12 is brushed and sprayed to remove any residual particles thereon. Both sides of a semiconductor wafer 12 are brushed simultaneously. A semiconductor wafer 12 is cleaned by applying equal amounts of pressure to both ends of the brush assembly for a predetermined period of time. Alternatively, the brush cleaning apparatuses 34 may be configured to brush one side at a time.

After each semiconductor wafer 12 has been brushed twice, the next clean station is a drying apparatus 36. The drying apparatus 36 is also known as a spin-rinse/dryer 36 since it rinses, spins, and dries a semiconductor wafer 12. A spun and dried wafer 12 is then moved to an unload station 38. A semiconductor wafer 12 in the unload station 38 represents a clean wafer.

Figure 5:
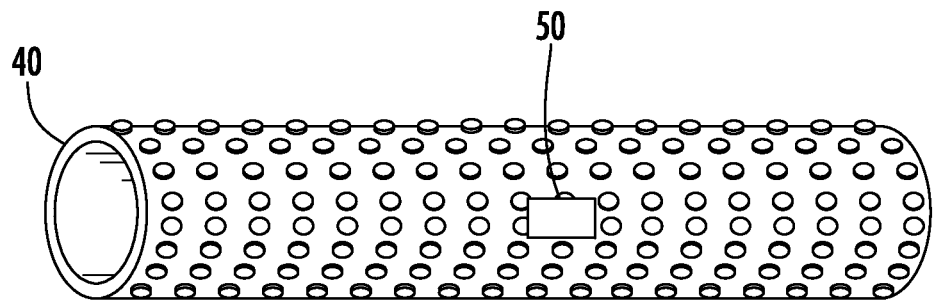
FIG. 5 is a perspective view of a rotary brush from the brush cleaning apparatus shown in FIG. 4 with a single optical window integrated therein.
Figure 6:
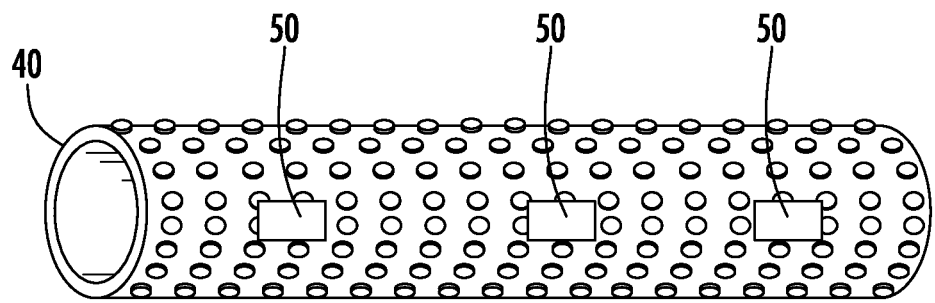
FIG. 6 is a perspective view of a rotary brush from the brush cleaning apparatus shown in FIG. 4 with multiple optical windows integrated therein.

A brush cleaning apparatus 34 from the second and third stations will now be discussed in greater detail in reference to FIGS. 4-6. The brush cleaning apparatus 34 is configured the same for each station, and includes a pair of rotary brushes 40 each configured to be positioned to clean a semiconductor wafer 12. An optical sensing device 42 is associated with each rotary brush 40 to sense a separation distance between a reference position 44 thereon and the semiconductor wafer 12. An actuator 47 is coupled to each optical sensing device 42 and is configured to position the rotary brush 40 based upon the separation distance between the reference position 44 on the rotary brush 40 and the semiconductor wafer 12.

By precisely controlling the separation distance between the rotary brushes 40 and the semiconductor wafer 12 with respect to the reference position 44, wafer yield and efficiency are advantageously improved. As noted above, if the separation distance is too tight, residual particles from a CMP operation may scratch the semiconductor wafer 12 as they are brushed off. If the separation distance is too loose, some of the residual particles will not be removed. Since the semiconductor wafer 12 is a double sided wafer, the same components are installed on the other side of the wafer.

Determination and control of the separation distance between the rotary brush 40 and the semiconductor wafer 12 with respect to a reference position is performed before brushing begins. This reduces the chance of having distorted measurements that may be caused by wetting solutions being applied to surfaces of the semiconductor wafer 12 during cleaning. Nonetheless, determination and control of the separation distance may be made in situ (i.e., during cleaning) provided the measurements are not distorted.

In the illustrated embodiment, the optical sensing device 42 is positioned inside or within the rotary brush 40. Consequently, each rotary brush 40 includes an optical window 60 formed therein, as illustrated in FIG. 5. The optical sensing device 42 includes an optical transmitter 46 and an optical receiver 48. The optical transmitter 46 transmits an optical signal 50 through the optical window 60 to the semiconductor wafer 12. This results in a reflected optical signal 52 being directed back through the optical window 60 to the optical receiver 48.

A controller 70 is coupled between the optical sensing device 42 and the actuator 47. The controller 70 uses the optical signals 50, 52 to determine the separation distance between the reference position 44 on the rotary brush 40 and semiconductor wafer 12, as readily appreciated by those skilled in the art.

The actuator 47 is coupled to an arm 72 that is coupled to at least one side of the rotary brush 40. Although not illustrated, the other side of the rotary brush 40 may be coupled to a motor that rotates the brush. The illustrated embodiment is not limited to the support mechanisms (e.g., arm 72) used to support a rotary brush 40. Other support mechanism may be used. In addition, the rotary brushes 40 may be enclosed within a chamber, although not illustrated.

The actuator 47 is under the control of the controller 70. In the illustrated embodiment, the controller 70 is separate from the optical sensing device 42. Alternatively, the controller 70 may be positioned within the optical sensing device 42.

The controller 70 includes a processor 74 to determine the separation distance between the rotary brush 40 and the semiconductor wafer 12 with respect to the reference position 44. This determination is made based on the optical signal 50 and the corresponding reflected optical signal 52, as readily appreciated by those skilled in the art. Even though the reference position 44 is illustrated with respect to a front face of the optical sensing device 42, the reference position may be picked to be a different location. The processor 74 also determines a difference between the sensed separation distance and a desired separation distance, and operates the actuator 47 based on the determined difference.

To uniformly measure the separation distance between the rotary brush 40 and the semiconductor wafer 12 with respect to the reference position 44, multiple optical sensing devices 42 may be positioned within the rotary brush 40. The rotary brush 40 would then have an optical window 60 for each optical sensing device 42 positioned therein. For example, if the rotary brush 40 included three optical sensing devices 42 positioned therein, then there would be three optical windows 60, as illustrated in FIG. 6.

As readily appreciated by those skilled in the art, each rotary brush 40 may be porous and/or sponge like and may include a resilient material, such as polyvinyl acetate (PVA). The rotary brushes 40 may also include other materials, or may include different materials. The type of brushes 40 have an effect on the desired separation distance between the reference position 44 and the surface of the semiconductor wafer 12 even though the brushes contact the surfaces of the semiconductor wafer 12 being cleaned.

Figure 4:
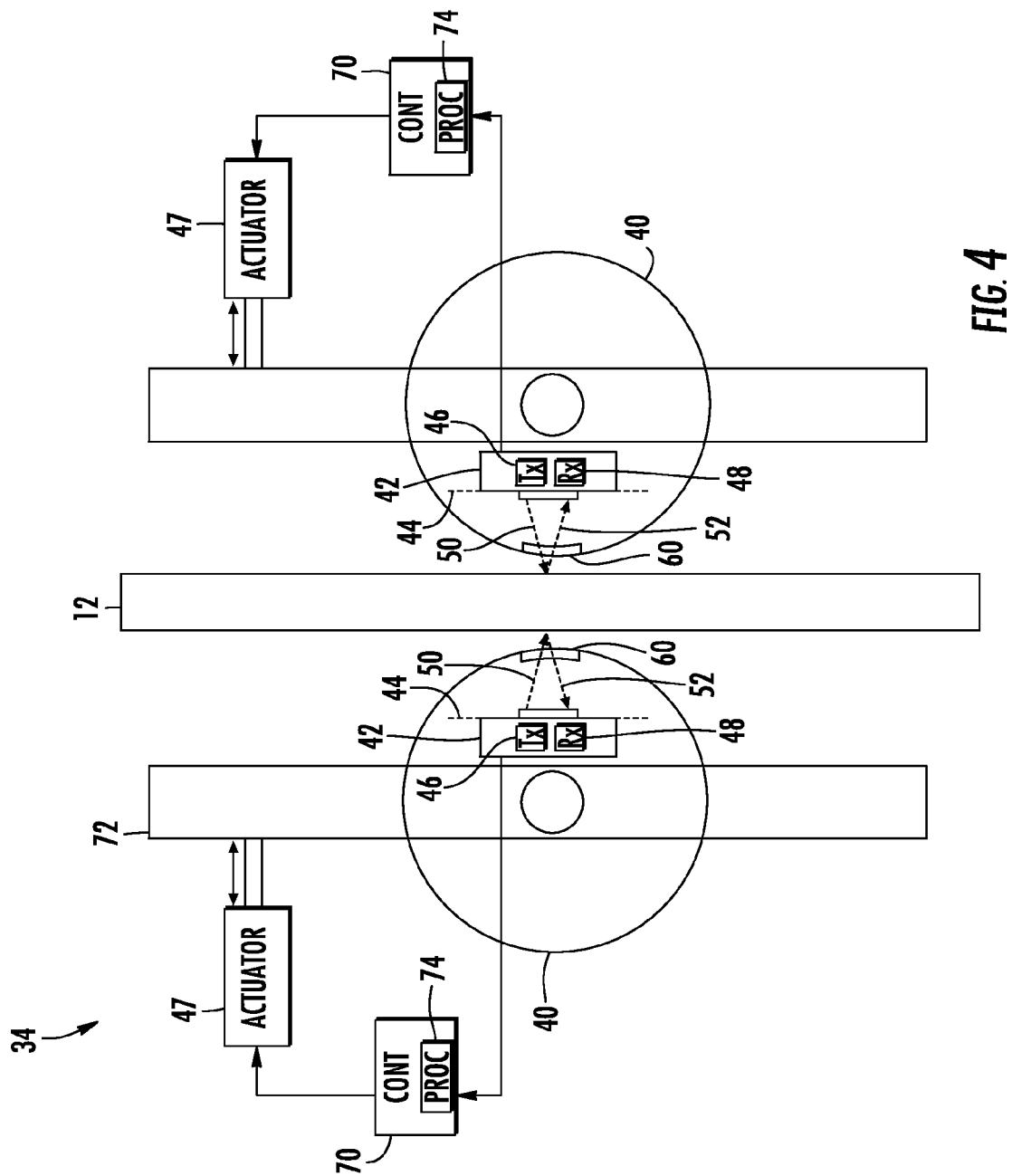
FIG. 4 is a schematic diagram of a brush cleaning apparatus with optical sensing devices inside the rotary brushes in accordance with the present invention.

Each optical window 60 may be formed as a separate component with respect to a corresponding optical sensing device 42 associated therewith, as illustrated in FIG. 4. In this configuration, the optical window 60 is held in place by the rotary brush 40. That is, the optical window 60 is integrated into the rotary brush 40. The optical sensing device 42 is positioned within the rotary brush 40 separately from the optical window 60. Alternatively, each optical window 60 may be formed to directly contact or connect with a corresponding optical sensing device 42. In this configuration, the optical sensing device 42 and optical window 60 are positioned within the rotary brush 40 at the same time.

Each optical window 60 may be formed out of plastic or glass, for example. Other materials that are transparent to the optical signals 50, 52 are readily acceptable also.

Figure 7:
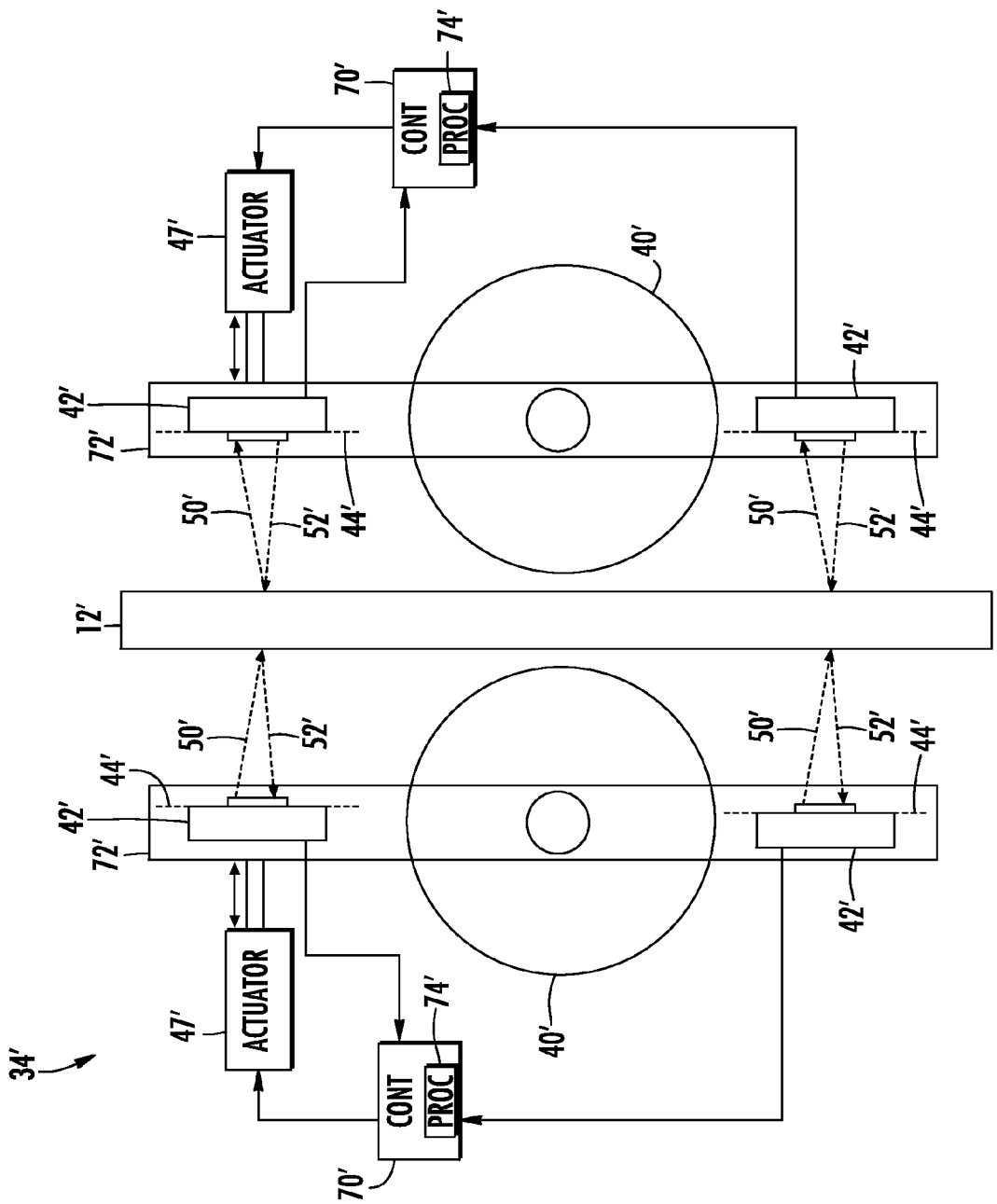
FIG. 7 is a schematic diagram of the brush cleaning apparatus shown in FIG. 4 with the optical sensing devices outside the rotary brushes.

Referring now to FIG. 7, another embodiment of the brush cleaning apparatus 34' is based on the optical sensing devices 42' being outside or external from the rotary brushes 40'. For example, one or more optical sensing devices 42' are carried by an arm 72' used to support at least one side of the rotary brush 40'. In this embodiment, the rotary brushes 40' no longer require an optical window.

Figure 8:
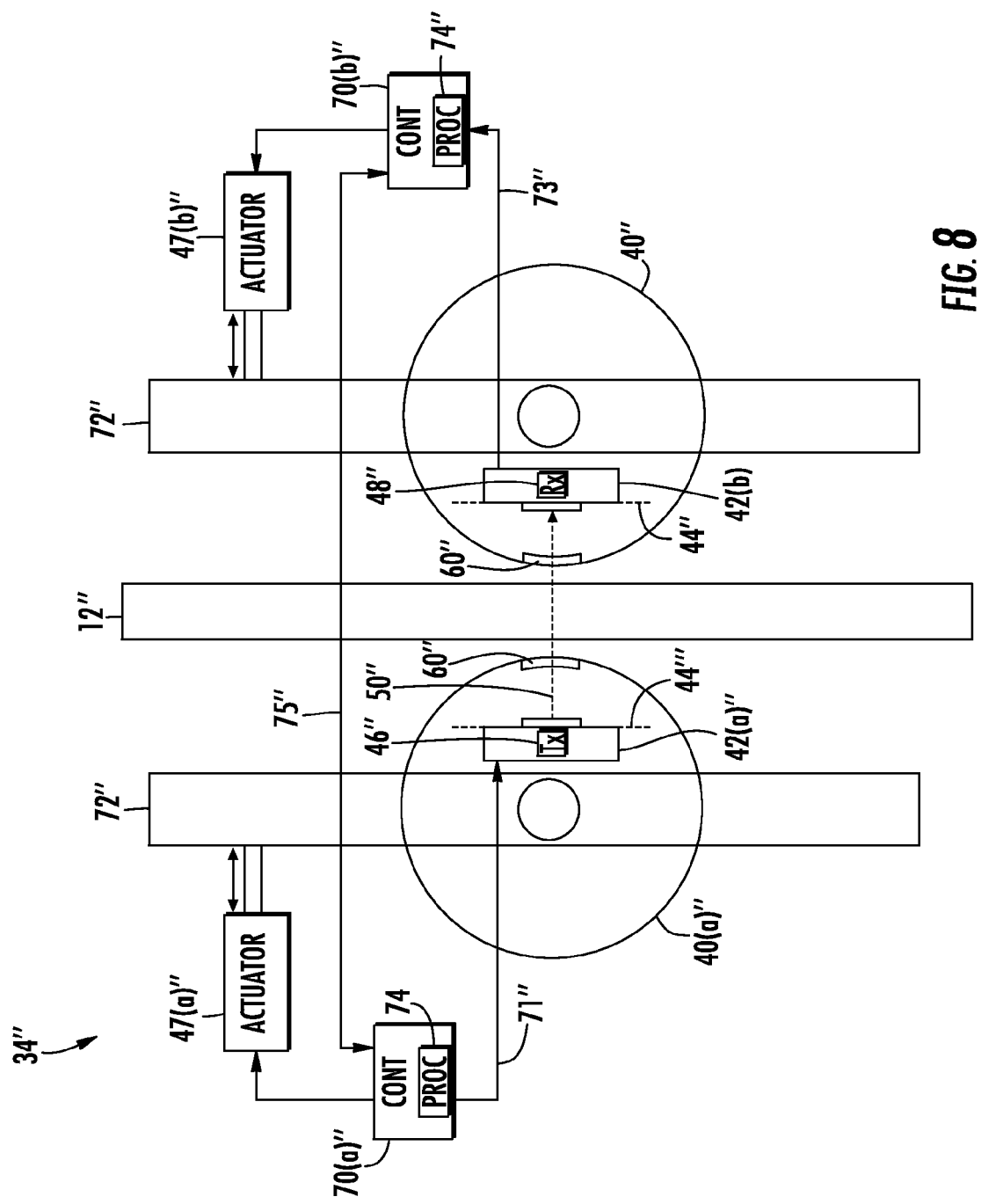
FIG. 8 is a schematic diagram of a different embodiment of a brush cleaning apparatus with coordinated optical sensing devices inside the rotary brushes in accordance with the present invention.

Yet another embodiment of the brush cleaning apparatus 34" will now be discussed in reference to FIG. 8. In this embodiment, the optical sensing devices 42" between the rotary brushes 40" coordinate with one another through the semiconductor wafer 12". For example, a first optical sensing device 42(a)" includes a transmitter 46" for transmitting an optical signal 50" that is transparent to the semiconductor wafer 12". On the opposite side of the semiconductor wafer 12", a second optical sensing device 42(b)" includes a receiver 48" for receiving the optical signal 50" transmitted by the transmitter 46" and through the semiconductor wafer 12".

The received optical signal 50" is used to sense the separation distance with respect to the reference position 44". The frequency of the optical signal 50" may be in the infrared range, such as 155 nm, for example. Other frequencies allowing the transmitter 46" and receiver 48" to communicate through the semiconductor wafer 12" are also acceptable, as readily appreciated by those skilled in the art.

A first actuator 47(a)" is coupled to the first optical sensing device 42(a)" and is configured to position the first rotary brush 40(a)" based upon the sensed separation distance. A second actuator 47(b)" is coupled to the second optical sensing device 42(b)" and is configured to position the second rotary brush 40(b)" based upon the sensed separation distance. The transmitted optical signal 50" includes a desired separation distance so that the first and second actuators 47(a)", 47(b)" both position the first and second rotary brushes 40(a)", 40(b)" to the desired separation distance.

Determination of the desired separation distance is determined ahead of time, and corresponds to the types of semiconductor wafers 12" being cleaned, as well as the types of brushes 40" being used to clean the wafers. The determination may be based on trial and error, for example. Based on a selected separation distance, the semiconductor wafer 12" is cleaned. Afterwards, the semiconductor wafer 12" is tested to determine wafer yield.

This process is repeated for other different separation distances, with each of the corresponding semiconductor wafers 12" being tested afterwards. After trial and error, the separation distance allowing for the best wafer yield is selected.

When subsequent semiconductor wafers 12" are to be brushed, the first and second optical sensing devices 42(a)", 42(b)" sense a separation distance of the first and second rotary brushes 40(a)", 40(b)" with respect to the next wafer to be cleaned. The information content of the optical signal 50'" to be transmitted between the two optical sensing devices 42(a)'", 42(b)'" corresponds to the selected separation distance allowing for the best wafer yield. One or both controllers 70(a)'", 70(b)'" receive this information from the first and second optical sensing devices 42(a)'", 42(b)'" so as to control positioning of the first and second rotary brushes 40(a)'", 40(b)'". This process is repeated for the next semiconductor wafer 12".

Figure 9:
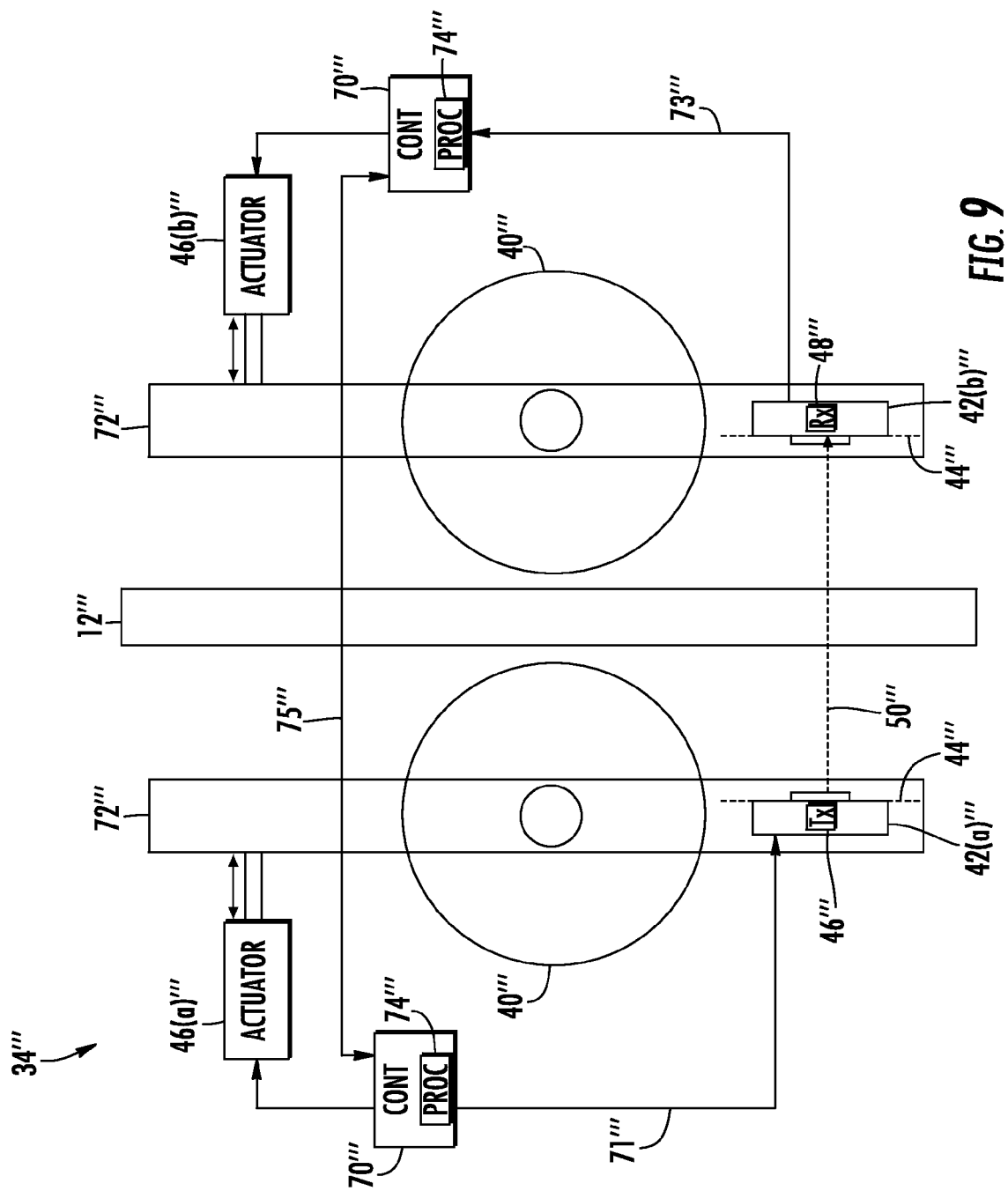
FIG. 9 is a schematic diagram of the brush cleaning apparatus shown in FIG. 8 with the coordinated optical sensing devices outside the rotary brushes.
Figure 10:
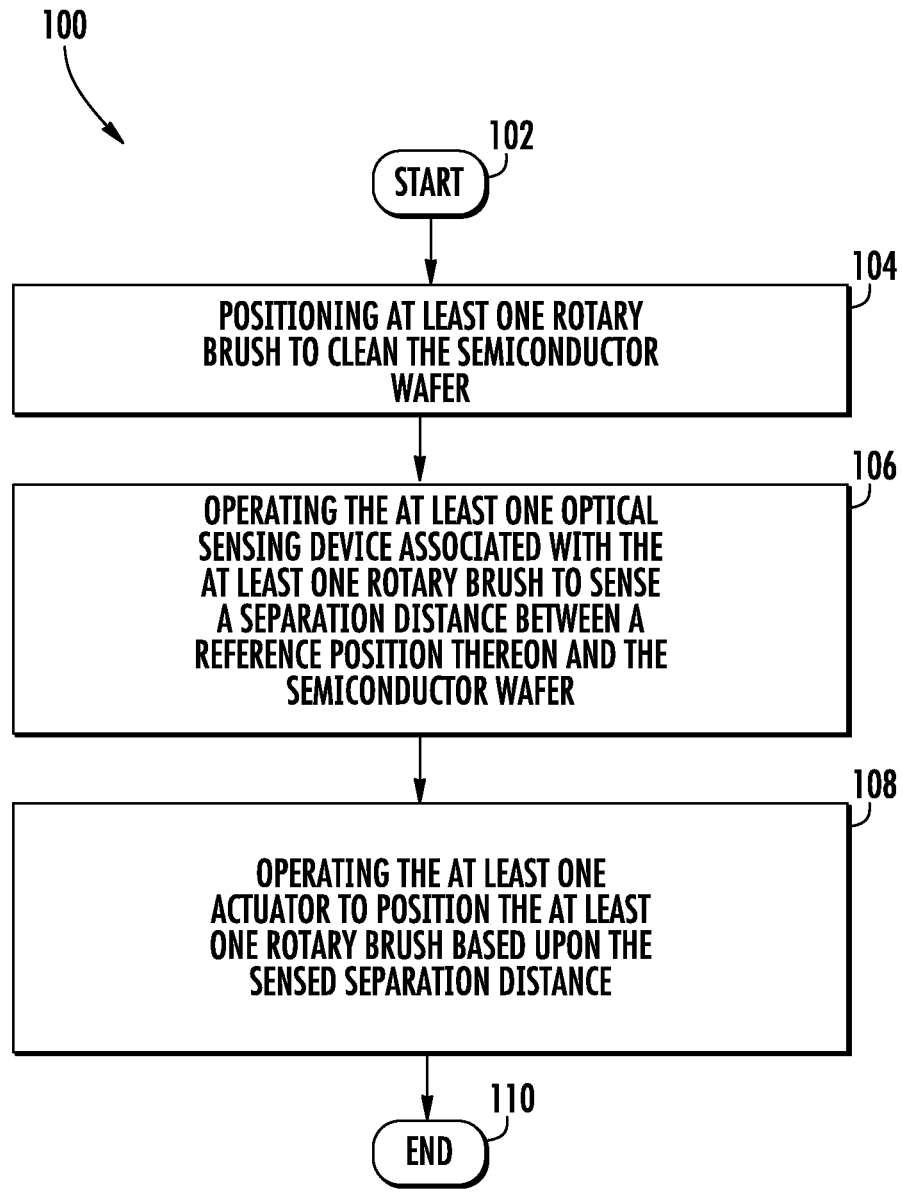
FIG. 10 is a flowchart illustrating a method for cleaning a semiconductor wafer in accordance with the present invention.

Referring now to FIG. 9, another embodiment of the brush cleaning apparatus 34'" is based on the optical sensing devices 42(a)'" and 42(b)'" being external the rotary brushes 40'". For example, the optical sensing devices 42(a)'" and 42(b)'" are carried by the arms 72'" used to support at least one side of the rotary brushes 40". In this embodiment, the rotary brushes 40'" no longer require an optical window.

A flowchart 100 for illustrating a method for cleaning a semiconductor wafer 12 with an apparatus 34 as described above will now be discussed. From the start (Block 102), the method comprises positioning the at least one rotary brush 40 to clean the semiconductor wafer 12 at Block 104. The at least one optical sensing device 42 associated with the at least one rotary brush is operated at Block 106 to sense a separation distance between a reference position 44 thereon and the semiconductor wafer 12. The at least one actuator 47 is operated at Block 108 to position the at least one rotary brush 40 based upon the sensed separation distance. The method ends at Block 110.

Figure 11:
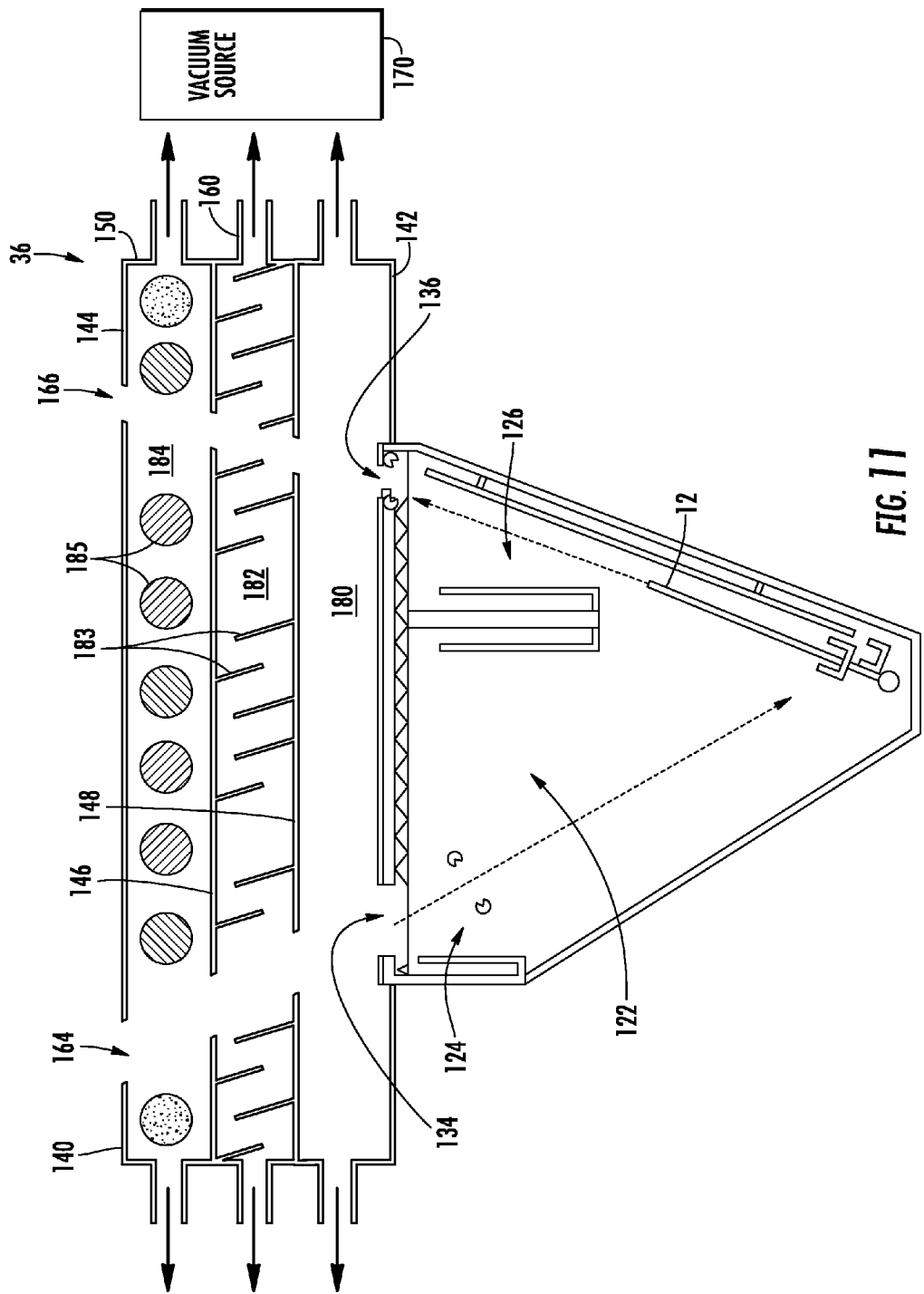
FIG. 11 is a cross-sectional side view of a drying apparatus with an exhaust control cap in accordance with the present invention.

Referring now to FIG. 11, the drying apparatus 36 for drying a semiconductor wafer 12 will now be discussed in greater detail. After each semiconductor wafer 12 has been brushed twice, the next cleaning station is the drying apparatus 36. The drying apparatus 36 is also known as a spin-rinse/dryer.

The drying apparatus 36 includes a processing chamber 122 that comprises a rinsing section 124 and a drying section 126 adjacent thereto. The rinsing section 124 has a chamber loading slot 134 associated therewith for receiving the semiconductor wafer 12. The drying section 126 has a chamber unloading slot 136 associated therewith for outputting the semiconductor wafer 12.

An exhaust control cap 140 is carried by the processing chamber 122 and includes a bottom wall 142, a top wall 144, and at least one intermediate wall 146 between the bottom and top walls. In the illustrative embodiment, there is an additional intermediate wall 148. A side wall 150 is coupled to the bottom wall 142, the intermediate walls 146, 148 and the top wall 144 to define a plurality of stacked or parallel exhaust sections 180, 182, 184.

The exhaust control cap 140 has a cap loading slot 164 aligned with the chamber loading slot 134, a cap unloading slot 166 aligned with the chamber unloading slot 136, and at least one exhaust port 160 configured to be coupled to a vacuum source 170. Even though cap loading slot 164 and the cap unloading slot 166 are illustrated as being spaced apart and separate from one another, in an alternate embodiment they may be formed as a single slot that is shared for loading and unloading the semiconductor wafers 12.

Alignment of the cap loading slot 164 with the chamber loading slot 134 may be at an angle, as illustrated in FIG. 11. The angle is in a non-vertical direction with respect to an upper surface of the processing chamber 122. The angle corresponds to a direction of travel of the semiconductor wafer 12 as it enters the rinsing section 124 of the processing chamber 122. The angle will vary between different embodiments of a drying apparatus 36 to support the actual direction of travel of the wafer 12. Similarly, alignment of the cap unloading slot 166 with the chamber unloading slot 136 may also be in a non-vertical direction with respect to an upper surface of the processing chamber 122, as illustrated in FIG. 11. The angle corresponds to a direction of travel of the semiconductor wafer 12 as it leaves the drying section 126 of the processing chamber 122. The angle will vary between different embodiments of the drying apparatus 36. For example, the angles may both be in a vertical direction with respect to the processing chamber 122, for example.

In the illustrative embodiment, the exhaust control cap 36 comprises a plurality of stacked exhaust sections 180, 182, 184. The exhaust control cap 140 is not limited to any particular number of exhaust sections. In addition, the exhaust control cap 140 is not limited to any particular configuration. The different configurations of the exhaust sections will now be discussed.

Exhaust section 180 is configured as a hollow section for fast exhaust control. The hollow section is free of any obstruction.

Exhaust section 182 is configured as a baffled section to prevent an exhaust backstream. The illustrated baffles 183 are staggered. However, other configurations for providing a baffled section are readily acceptable.

Exhaust section 184 is configured as a chemical species trap section for trapping and absorbing exhaust molecules. The illustrated chemical species trap 185 is configured as a plurality of spaced apart circular tabs. Adhesive may be used to secure the trap 185 to the exhaust section 184. However, other configurations for providing the chemical species trap 185 are readily acceptable. For example, the chemical species trap 185 may be configured as a rectangular strip.

In the illustrated embodiment, each exhaust section 180, 182, 184 has at least one exhaust port 160 associated therewith. The exhaust control cap 140 advantageously contains and exhausts vapor from the processing chamber 122 of the drying apparatus 36, and in particular, in the drying section 126. The stacked exhaust sections also help to reduce exhaust contamination of the semiconductor wafer 12 as it is being removed from the drying apparatus 36. Also, as the semiconductor wafer 12 is removed, the exhaust control cap 140 helps to prevent DI water or an IPA flow rate spike from causing a water mark or IPA to condense on the semiconductor wafer. This helps to improve wafer yield and reliability being decreased.

Figure 12:
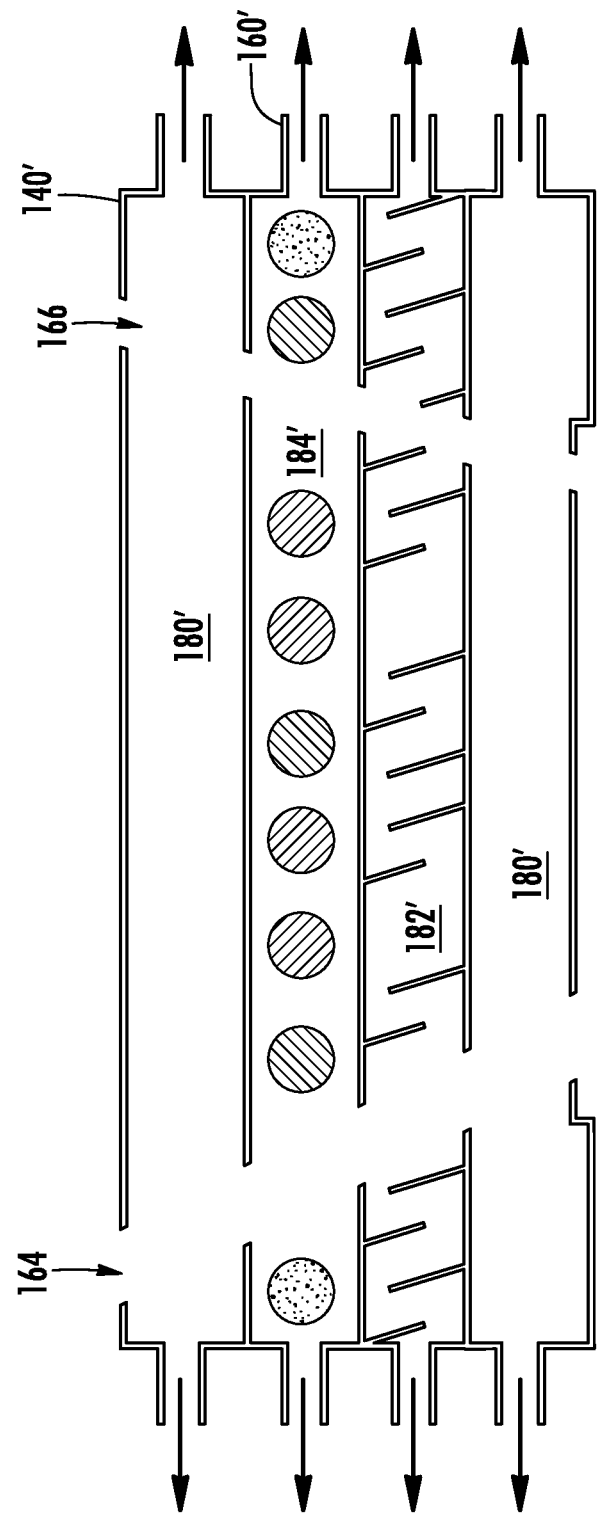
Figure 17:
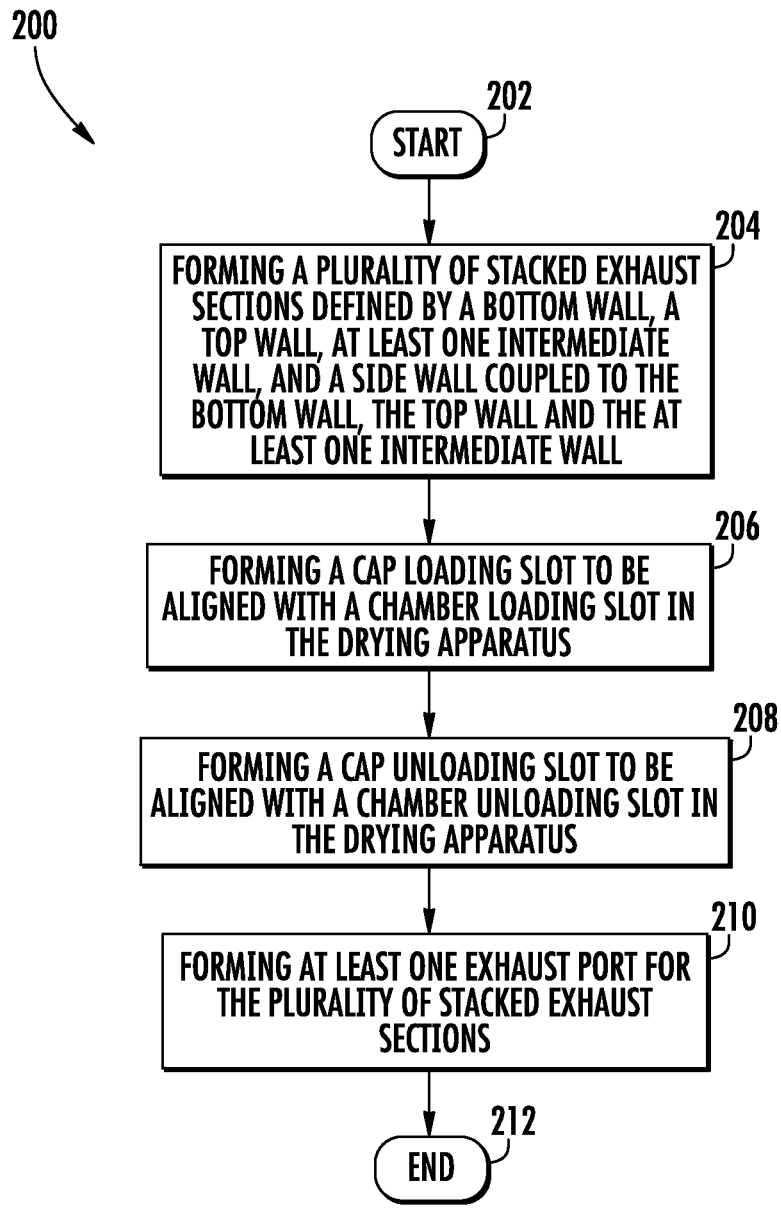
FIG. 17 is a flowchart illustrating a method for making an exhaust control cap in accordance with the present invention.

As noted above, the exhaust control cap 140 is not limited to any particular number of exhaust sections, or any particular configuration or order of the exhaust sections. For example, for the exhaust control cap 140' illustrated in FIG. 12 includes an additional hollow exhaust section 180'. For the exhaust control cap 140" illustrated in FIG. 13, only the hollow exhaust section 180" and the baffled exhaust section 182" are included. For the exhaust control cap 140'" illustrated in FIG. 14, only the hollow exhaust section 180'" and the chemical species trap section 184'" are included.

Referring now to FIGS. 15 and 16, the exhaust control cap 140 may further comprise cap loading slot doors 190 and cap unloading slot doors 194 that are slidabely positioned to provide further exhaust control. The cap loading slot doors 190 are slideably positioned over the cap loading slot 134. Similarly, the cap unloading slot doors 194 are slideably positioned over the cap unloading slot 136.

A door controller 196 operates the cap loading and unloading slot doors 190, 194 based on a position of the semiconductor wafer 12. In FIG. 15, the cap loading and unloading slot doors 190, 194 are open. In FIG. 16, the cap loading and unloading slot doors 190, 194 are closed.

Even though each exhaust section has its own corresponding cap loading and unloading slot doors 190, 194, this may not always be the case. Selected exhaust sections may have cap loading and unloading slot doors 190, 194. Alternatively, only the upper or outer most exhaust section may have cap loading and unloading slot doors 190, 194.

A flowchart 200 for illustrating a method for making an exhaust control cap 140 for a semiconductor wafer drying apparatus 36 as described above will now be discussed. From the start (Block 202) the method comprising forming at Block 204 a plurality of stacked exhaust sections 180, 182, 184 defined by a bottom wall, a top wall, at least one intermediate wall, and a side wall coupled to the bottom wall, the top wall and the at least one intermediate wall. A cap loading slot 164 is formed at Block 206 to be aligned with a chamber loading slot 134 in the drying apparatus 36. A cap unloading slot 166 is formed at Block 208 to be aligned with a chamber unloading slot 166 in the drying apparatus 36. The method further comprises forming at least one exhaust port 160 for the plurality of stacked exhaust sections 180, 182, 184 to be coupled to a vacuum source 170. The method ends at Block 212.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A cleaning apparatus for cleaning a semiconductor wafer comprising:
    at least one rotary brush configured to be positioned to clean the semiconductor wafer;
    at least one optical sensing device with a reference position thereon and associated with said at least one rotary brush to sense a separation distance between the reference position and the semiconductor wafer; and
    at least one actuator coupled to said at least one optical sensing device and configured to position the at least one rotary brush based upon the sensed separation distance so as to maintain a desired separation distance between the reference position and the semiconductor wafer.

2. The cleaning apparatus according to claim 1, wherein said at least one rotary brush comprises at least one optical window; and wherein said at least one optical sensing device is carried by said at least one rotary brush and aligned with said at least one optical window.

3. The cleaning apparatus according to claim 1, further comprising at least one arm coupled to said at least one rotary brush; and wherein said at least one actuator moves said at least one arm to position said at least one rotary brush.

4. The cleaning apparatus according to claim 3, wherein said at least one optical sensing device is external from said at least one rotary brush and is carried by said at least one arm.

5. The cleaning apparatus according to claim 1, further comprising a controller configured to determine a difference between the sensed separation distance and the desired separation distance, and to operate said at least one actuator based on the determined difference.

6. The cleaning apparatus according to claim 1, wherein said at least one optical sensing device comprises a transmitter for transmitting an optical signal to a surface of the semiconductor wafer, and a receiver for receiving a reflected optical signal from the surface of the semiconductor wafer, with the optical signal and the reflected optical signal being used to sense the separation distance.

7. The cleaning apparatus according to claim 1, wherein said at least one rotary brush comprises first and second rotary brushes on opposite sides of the semiconductor wafer; and wherein said at least one optical sensing device comprises:
    a first optical sensing device associated with said first rotary brush, and comprising a transmitter for transmitting an optical signal through the semiconductor wafer; and
    a second optical sensing device associated with said second rotary brush, and comprising a receiver for receiving the optical signal, with the received optical signal being used to sense the separation distance.

8. The cleaning apparatus according to claim 7, wherein said at least one actuator comprises a first actuator configured to position said first rotary brush based upon the sensed separation distance; and a second actuator configured to position said second rotary brush based upon the sensed separation distance.

9. The cleaning apparatus according to claim 8 wherein the transmitted optical signal comprises the desired separation distance so that said first and second actuators position said first and second rotary brushes to the desired separation distance.

10. A cleaning apparatus for cleaning a semiconductor wafer comprising:
    at least one rotary brush configured to be positioned to clean a surface of the semiconductor wafer;
    at least one optical sensing device with a reference position thereon and comprising
        a transmitter for transmitting an optical signal to the surface of the semiconductor wafer, and
        a receiver for receiving a reflected optical signal from the surface of the semiconductor wafer to sense a separation distance; and
    at least one actuator coupled to said at least one optical sensing device and configured to position the at least one rotary brush based upon the sensed separation distance so as to maintain a desired separation distance between the reference position and the semiconductor wafer.

11. The cleaning apparatus according to claim 10, wherein said at least one rotary brush comprises at least one optical window; and wherein said at least one optical sensing device is carried by said at least one rotary brush and aligned with said at least one optical window.

12. The cleaning apparatus according to claim 10, further comprising at least one arm coupled to said at least one rotary brush; and wherein said at least one actuator moves said at least one arm to position said at least one rotary brush.

13. The cleaning apparatus according to claim 12, wherein said at least one optical sensing device is external from said at least one rotary brush and is carried by said at least one arm.

14. The cleaning apparatus according to claim 10, further comprising a controller configured to determine a difference between the sensed separation distance and the desired separation distance, and to operate said at least one actuator based on the determined difference.

15. A method for cleaning a semiconductor wafer with a cleaning apparatus comprising at least one rotary brush, at least one optical sensing device with a reference position thereon and associated with the at least one rotary brush, and at least one actuator coupled to the at least one rotary brush, the method comprising:
    positioning the at least one rotary brush to clean the semiconductor wafer;

operating the at least one optical sensing device associated with the at least one rotary brush to sense a separation distance between a reference position thereon and the semiconductor wafer; and operating the at least one actuator to position the at least one rotary brush based upon the sensed separation distance so as to maintain a desired separation distance between the reference position and the semiconductor wafer.

16. The method according to claim 15, wherein the at least one rotary brush comprises at least one optical window; and wherein the at least one optical sensing device is carried by the at least one rotary brush and aligned with the at least one optical window.

17. The method according to claim 15, wherein the apparatus comprises at least one arm coupled to the at least one rotary brush; and wherein the at least one actuator is operated to move the at least one arm to position the at least one rotary brush.

18. The method according to claim 17, wherein the at least one optical sensing device is external from the at least one rotary brush and is carried by the at least one arm.

19. The method according to claim 15, further comprising using a controller configured for determining a difference between the sensed separation distance and the desired separation distance, and for operating the at least one actuator based on the determined difference.

20. The method according to claim 15, wherein the at least one optical sensing device comprises a transmitter for transmitting an optical signal to a surface of the semiconductor wafer, and a receiver for receiving a reflected optical signal from the surface of the semiconductor wafer, with the optical signal and the reflected optical signal being used by the at least one optical sensing device to sense the separation distance.

21. The method according to claim 15, wherein the at least one rotary brush comprises first and second rotary brushes on opposites sides of the semiconductor wafer; and wherein the at least one optical sensing device comprises a first optical sensing device associated with the first rotary brush, and comprising a transmitter for transmitting an optical signal through the semiconductor wafer; and a second optical sensing device associated with the second rotary brush, and comprising a receiver for receiving the optical signal, with the received optical signal being used to sense the separation distance.

22. A cleaning apparatus for cleaning a semiconductor wafer comprising:
at least one rotary brush comprising at least one optical window and configured to be positioned to clean the semiconductor wafer;
at least one optical sensing device with a reference position thereon and carried by said at least one rotary brush and aligned with said at least one optical window to sense a separation distance between the reference position and the semiconductor wafer; and
at least one actuator coupled to said at least one optical sensing device and configured to position the at least one rotary brush based upon the sensed separation distance.

23. The cleaning apparatus according to claim 22, further comprising at least one arm coupled to said at least one rotary brush; and wherein said at least one actuator moves said at least one arm to position said at least one rotary brush.

24. The cleaning apparatus according to claim 22, further comprising a controller configured to determine a difference between the sensed separation distance and the desired separation distance, and to operate said at least one actuator based on the determined difference.

25. The cleaning apparatus according to claim 22, wherein said at least one optical sensing device comprises a transmitter for transmitting an optical signal to a surface of the semiconductor wafer, and a receiver for receiving a reflected optical signal from the surface of the semiconductor wafer, with the optical signal and the reflected optical signal being used to sense the separation distance.

26. The cleaning apparatus according to claim 22, wherein said at least one rotary brush comprises first and second rotary brushes on opposite sides of the semiconductor wafer; and wherein said at least one optical sensing device comprises:
a first optical sensing device associated with said first rotary brush, and comprising a transmitter for transmitting an optical signal through the semiconductor wafer; and
a second optical sensing device associated with said second rotary brush, and comprising a receiver for receiving the optical signal, with the received optical signal being used to sense the separation distance.

27. A method for cleaning a semiconductor wafer with a cleaning apparatus comprising at least one rotary brush comprising at least one optical window, at least one optical sensing device with a reference position thereon and carried by the at least one rotary brush, and at least one actuator coupled to the at least one rotary brush, the method comprising:
aligning the at least one optical sensing device with the at least one optical window;
positioning the at least one rotary brush to clean the semiconductor wafer;
operating the at least one optical sensing device to sense a separation distance between the reference position and the semiconductor wafer; and
operating the at least one actuator to position the at least one rotary brush based upon the sensed separation distance.

28. The method according to claim 27, wherein the apparatus comprises at least one arm coupled to the at least one rotary brush; and wherein the at least one actuator is operated to move the at least one arm to position the at least one rotary brush.

29. The method according to claim 27, further comprising using a controller configured for determining a difference between the sensed separation distance and the desired separation distance, and for operating the at least one actuator based on the determined difference.

30. The method according to claim 27, wherein the at least one optical sensing device comprises a transmitter for transmitting an optical signal to a surface of the semiconductor wafer, and a receiver for receiving a reflected optical signal from the surface of the semiconductor wafer, with the optical signal and the reflected optical signal being used by the at least one optical sensing device to sense the separation distance.

31. The method according to claim 27, wherein the at least one rotary brush comprises first and second rotary brushes on opposites sides of the semiconductor wafer; and wherein the at least one optical sensing device comprises a first optical sensing device associated with the first rotary brush, and comprising a transmitter for transmitting an optical signal through the semiconductor wafer; and a second optical sensing device associated with the second rotary brush, and comprising a receiver for receiving the optical signal, with the received optical signal being used to sense the separation distance.

* * * * *